United States Patent [19]

Kashida et al.

[11] Patent Number: 5,155,734
[45] Date of Patent: Oct. 13, 1992

[54] ERROR CORRECTING DEVICE

[75] Inventors: Motokazu Kashida, Musashino; Shinichi Yamashita, Yokohama, both of Japan

[73] Assignee: Canon Kabushiki Kaisha, Tokyo, Japan

[21] Appl. No.: 477,424

[22] Filed: Feb. 9, 1990

[30] Foreign Application Priority Data

Feb. 16, 1989 [JP] Japan ................... 1-36924

[51] Int. Cl.⁵ ................... G06F 11/10; H03M 13/00
[52] U.S. Cl. ................... 371/37.1; 371/5.1; 371/37.8; 395/575; 395/775
[58] Field of Search ............ 371/37.1, 37.2, 5.1, 371/37.8

[56] References Cited

U.S. PATENT DOCUMENTS

| | | | |
|---|---|---|---|
| 3,685,014 | 8/1972 | Hsiao et al. | 371/37.2 |
| 4,107,652 | 8/1978 | Tanahashi et al. | 371/37.1 |
| 4,142,174 | 2/1979 | Chen et al. | 371/37.1 |
| 4,555,729 | 11/1985 | Driessen | 371/37.1 |
| 4,567,594 | 1/1986 | Deodhar | 371/37.8 |
| 4,618,954 | 10/1986 | Otobe et al. | 371/5.1 |
| 4,696,007 | 9/1987 | Moriyama | 371/37.1 |
| 4,951,282 | 8/1990 | Mester | 371/5.1 |
| 4,958,349 | 9/1990 | Tanner et al. | 371/37.1 |

OTHER PUBLICATIONS

IBM Tech. Disc. Bull., vol. 3, No: 6, pp. 23-26, Nov. 1960.

*Primary Examiner*—Jerry Smith
*Assistant Examiner*—Henry C. Lebowitz
*Attorney, Agent, or Firm*—Fitzpatrick, Cella, Harper & Scinto

[57] ABSTRACT

There is provided an error correcting device for correcting errors of a received message in accordance with a processing program including a plurality of error correcting processes for correcting different numbers of errors, wherein a plurality of check codes which are used to discriminate the shift to either one of the plurality of error correcting processes for correcting different numbers of errors and which are formed by syndromes formed from the reception code are sequentially serially generated, the plurality of check codes are output in parallel and the shift of the process in the processing program is executed in accordance with the check codes which were output in parallel.

14 Claims, 4 Drawing Sheets

ERROR CORRECTING DEVICE

BACKGROUND OF THE INVENTION

1. Field of the Invention

The present invention relates to an error correcting device and, more particularly, to the realization of its high processing speed.

2. Related Background Art

In an error correcting device using what is called a program control system in which error correcting processes are executed by a microprocessor or the like in accordance with a predetermined program, a discrimination of a jump (shift of the process) of the program and a change in count value of a program counter in association with the program jump are executed each time the result of the discrimination is obtained.

A conventional procedure of the processes will now be described with respect to the syndrome discrimination of the Reed Solomon code as an example. The Reed Solomon code is a multi-dimension block code of a cyclic type and, in recent years, it has been applied to various fields and has widely been known.

A decoding method of the Reed Solomon code having a code length (n) and (k) information symbols and comprising (n-k) check symbols will now be described. It is also assumed that each symbol is an element of a Galois field GF ($2^m$), a finite field having m binary bits (i.e., $2^m$ elements).

In this case, a generating polynomial g(x) of the (t)-ply error correction Reed Solomon code is expressed by the following equation (1) or (2) in which ($\alpha$) is a primitive element of the Galois field GF ($2^m$).

$$g(x) = (x+\alpha)(x+\alpha^2) \ldots (x+\alpha^{2t}) \quad (1)$$

$$g(x) = (x+\alpha_0)(x+\alpha) \ldots (x+\alpha^{2t-1}) \quad (2)$$

On the other hand, when a transmission code word is expressed by C(x) and a reception code word is expressed by R(x) and an error polynomial is expressed by E(x), the following relation is satisfied among them.

$$R(x) = C(x) + E(x) \quad (3)$$

In this case, the coefficients of the polynomial are included in the Galois field GF ($2^m$) and the error polynomial E(x) includes only the terms corresponding to the error location and a value (size).

Therefore, assuming that an error value at a position $x_j$ is set to $Y_j$.

$$E(x) = \sum_j Y_j x_j \quad (4)$$

In the equation (4), $\Sigma$ denotes the sum of errors at all positions.

Assuming that the syndromes $S_i$ are defined as follows $$S_i = R(\alpha^i) \text{ [where, } i=0, 1 \ldots 2t-1] \quad (5)$$

from the equation (3), $$S_i = C(\alpha^i) + E(\alpha^i)$$

In this case, since C(x) can always be divided by g(x), $$C(\alpha^i) = 0$$

Therefore, $$S_i = E(\alpha^i)$$

From the equation (4), the syndromes can be expressed as follows.

$$S_i = E(\alpha^i) = \sum_j Y_j(\alpha^i)^j = \sum_j Y_j X_j^i \quad (6)$$

However, it is assumed that $\alpha^j = X_j$ and $X_j$ denotes an error location in the case of $\alpha^j$.

When the number of errors is set to e, an error location polynomial $\sigma(x)$ is defined as follows.

$$\sigma(x) = \prod_i (x - X_i) \quad (7)$$
$$= x^e + \sigma_1 x^{e-1} + \ldots + \sigma_e$$

The following relation is provided between $\sigma_1$ to $\sigma_e$ in the equation (7) and the syndromes $S_i$.

$$S_{i+e} + \sigma_1 S_{i+e-1} + \ldots \sigma_{e-1} S_{i+1} + \sigma_e S_i \quad (8)$$

Namely, the above Reed Solomon code is decoded in the following procedure.

(I) The syndromes $S_i$ are calculated by the equation (5).

(II) The coefficients $\sigma_1$ to $\sigma_e$ of the error location polynomial are calculated by the equation (8).

(III) A root $X_j$ of the error location polynomial is obtained by the equation (7).

(IV) The error value $Y_j$ is obtained by the equation (6) and the error polynomial is obtained by the equation (4).

(V) The error correction is executed by the equation (3).

A practical example of the error correction by the decoding procedure as mentioned above will now be described with respect to the case where four check symbols are used in one-block data.

That is, the generating polynomial g(x) in this case is as follows.

$$g(x) = (x + 1)(x + \alpha)$$
$$(x + \alpha^2)(x + \alpha^3)$$

The correction until the double error can be corrected.

The case of actually executing the error correction will now be considered with respect to the following four cases: e=0; e=1, e=2, and e≧3. When e=0, this means that the received message word is correct, so that no error correcting process is executed. On the other hand, when e≧3, this also means that such a case exceeds the error correcting capability, so that the error correcting process other than the process to set an error flag into 1 is not executed. That is, the error correcting process is actually executed only in the cases where e=1 and e=2.

The error correcting process is schematically executed by the following procedure in correspondence to the above decoding procedures (I) and (II).

(a) The syndromes $S_0$ to $S_3$ are calculated.

(b) The syndromes $S_0$ to $S_3$ are checked and when $S_0 = S_1 = S_2 = S_3 = 0$, it is determined that e=0 and the error correcting process is finished. Further, when only one of the values of the syndromes $S_0$ to $S_3$ is equal to 0, this means that $e \neq 1$. When any two or more of the values of the syndromes $S_0$ to $S_3$ are equal to 0, it will be obvious from the equation (6) that $e \geq 3$.

(c) When the equation (8) is rewritten with respect to $e=1$ and $e=2$.

in the case where $e=1$.

$$\left. \begin{array}{l} S_1 + \sigma_1 S_0 = 0 \\ S_2 + \sigma_1 S_1 = 0 \\ S_3 + \sigma_1 S_2 = 0 \end{array} \right\} \quad (9)$$

and in the case where $e=2$.

$$\left. \begin{array}{l} S_2 + \sigma_1 S_1 + \sigma_2 S_0 = 0 \\ S_3 + \sigma_1 S_2 + \sigma_2 S_1 = 0 \end{array} \right\} \quad (10)$$

It is now assumed that the actual decoder starts the operation from the case where $e=1$. Then, the solution $\sigma_1$ which satisfies the simultaneous equation (9) must be first obtained. If such a solution does not exist, the decoder must obtain the solutions $\sigma_1$ and $\sigma_2$ which satisfy the simultaneous equation (10) with respect to the case of $e=2$. If no solution is derived here, it can be regarded such that $e \geq 3$.

The solution $\sigma_1$ of the equation (9) is obtained as follows.

$$\sigma_1 = \frac{S_1}{S_0} = \frac{S_2}{S_1} = \frac{S_3}{S_2}$$

The solutions $\sigma_1$ and $\sigma_2$ of the equation (10) are obtained as follows.

$$\sigma_1 = \frac{S_0 S_3 + S_1 S_2}{S_1^2 + S_0 S_2}, \quad \sigma_2 = \frac{S_1 S_3 + S_2^2}{S_1^2 + S_0 S_2}$$

In the above procedures, the values of the various equations are calculated and compared in each step. It is then necessary to change the program flow indicative of the processing in accordance with the result of the discrimination.

For instance, the number e of errors can be determined as shown in Table 1 in accordance with the values of the syndromes $S_0$ to $S_3$ in the step (b).

TABLE 1

| $S_0$ | $S_1$ | $S_2$ | $S_3$ | e |
|---|---|---|---|---|
| $=0$ | $=0$ | $=0$ | $=0$ | $=0$ |
| $=0$ | $=0$ | $=0$ | $\neq 0$ | $\geq 3$ |
| $=0$ | $=0$ | $\neq 0$ | $=0$ | $\geq 3$ |
| $=0$ | $=0$ | $\neq 0$ | $\neq 0$ | $\geq 3$ |
| $=0$ | $\neq 0$ | $=0$ | $=0$ | $\geq 3$ |
| $=0$ | $\neq 0$ | $=0$ | $\neq 0$ | $\geq 3$ |
| $=0$ | $\neq 0$ | $\neq 0$ | $=0$ | $\geq 3$ |
| $=0$ | $\neq 0$ | $\neq 0$ | $\neq 0$ | $\geq 2$ |
| $\neq 0$ | $=0$ | $=0$ | $=0$ | $\geq 3$ |
| $\neq 0$ | $=0$ | $=0$ | $\neq 0$ | $\geq 3$ |
| $\neq 0$ | $=0$ | $\neq 0$ | $=0$ | $\geq 3$ |
| $\neq 0$ | $=0$ | $\neq 0$ | $\neq 0$ | $\geq 2$ |
| $\neq 0$ | $\neq 0$ | $=0$ | $=0$ | $\geq 3$ |
| $\neq 0$ | $\neq 0$ | $=0$ | $\neq 0$ | $\geq 3$ |
| $\neq 0$ | $\neq 0$ | $\neq 0$ | $=0$ | $\geq 3$ |
| $\neq 0$ | $\neq 0$ | $\neq 0$ | $\neq 0$ | $\geq 1$ |

An outline of the flow of the processes according to the determination is shown in a flowchart of FIG. 1. The step shown by "$e \geq 3$" in FIG. 1 denotes that the number of errors is decided to be 3 or more and that the processing routine advances to the processing routine for the excessive error correcting capability. The step shown by "$e \geq 2$" denotes that the number of errors is decided to be 2 or more and that the processing routine advances to the processing routine for correction of double error. Further, the step shown by "$e \geq 1$" denotes that the number of errors is decided to be 1 or more and that the processing routine advances to the processing routine for correction of single error.

On the other hand, consider the following as one example in which the flow of the program is changed as mentioned above, that is, the program is jumped. When the coefficients $\sigma_1$ and $\sigma_2$ of the error location polynomial are calculated in the foregoing step (c), checks are made to see if the denominator $(S_1{}^2 + S_0 S_2)$ and the numerators $(S_0 S_3 + S_1 S_2)$ and $(S_1 S_3 + S_2{}^2)$ are equal to 0 and the program is jumped in accordance with the results of the discriminations. That is, when the denominator $(S_1{}^2 + S_0 S_2)$ is equal to 0, the processing routine advances to the processing routine for the excessive error correcting capability. When either one of the numerators $(S_0 S_3 + S_1 S_2)$ and $(S_1 S_3 + S_2{}^2)$ is equal to 0, the processing routine advances to the processing routine for correction of single error.

However, in the above conventional example using $S_0$, $S_1$ and $S_2$ for discrimination rather than $\sigma 1$ and $\sigma 2$, for instance, assume that the program is jumped in the case where the result of the discrimination is "Yes" ("Y") in each of the discriminating step in the flowchart of FIG. 1. It is then necessary to jump the program one or two times until the processing routine advances to the double-error correction processing routine through the step shown by "$e \geq 2$". It is necessary to jump the program about four times until the processing routine advances to the no-error processing routine through the step shown by "$e = 0$". Moreover, it will be obvious from FIG. 1 that a fairly large program step area is needed to describe the above programs.

On the other hand, even in the procedure to calculate the coefficients $\sigma_1$ and $\sigma_2$ of the above error location polynomial, there is also an increase in the program step area increases. Even in the case of sequentially executing the steps of checking to see if $(S_1{}^2 + S_0 S_2)$, $(S_0 S_3 + S_1 S_2)$, and $(S_1 S_3 + S_2{}^2)$ are equal to 0 or not, the program step area also similarly increases.

As mentioned above, when the program step area increases and the possibility of the program jump increases, it takes time to execute the above programs so that processes cannot be performed at high speed. Thus, it is difficult to process the received message of a high bit rate.

SUMMARY OF THE INVENTION

Under the aforementioned circumstances, it is an object of the invention to solve the foregoing problems.

Another object of the invention is to realize the high processing speed of an error correcting device for processing in accordance with programs.

Still another object of the invention is to provide an error correcting device which can reduce the number of program processing steps and the number of program jumping times in the error correcting device.

Under such objects, according to the present invention, as a preferred embodiment, there is provided an error correcting device comprising: (a) a processor for executing a processing program which includes a plurality of kinds of code error correction processing routines and is used to correct code errors of a received message; (b) first means for sequentially serially outputting a plurality of check codes to determine a shift to either one of the plurality of kinds of code error correction processing routines by using a plurality of syndromes formed from the reception code; (c) second means for outputting the plurality of check codes in parallel; and (d) third means for executing the shift of the program in the processing program in accordance with an output of the second means.

The above and other objects and features of the present invention will become apparent from the following detailed description and the appended claims with reference to the accompanying drawings.

DETAILED DESCRIPTION OF THE PREFERRED EMBODIMENTS

An embodiment of the present invention will be described hereinbelow with reference to the drawings.

Figure 1:
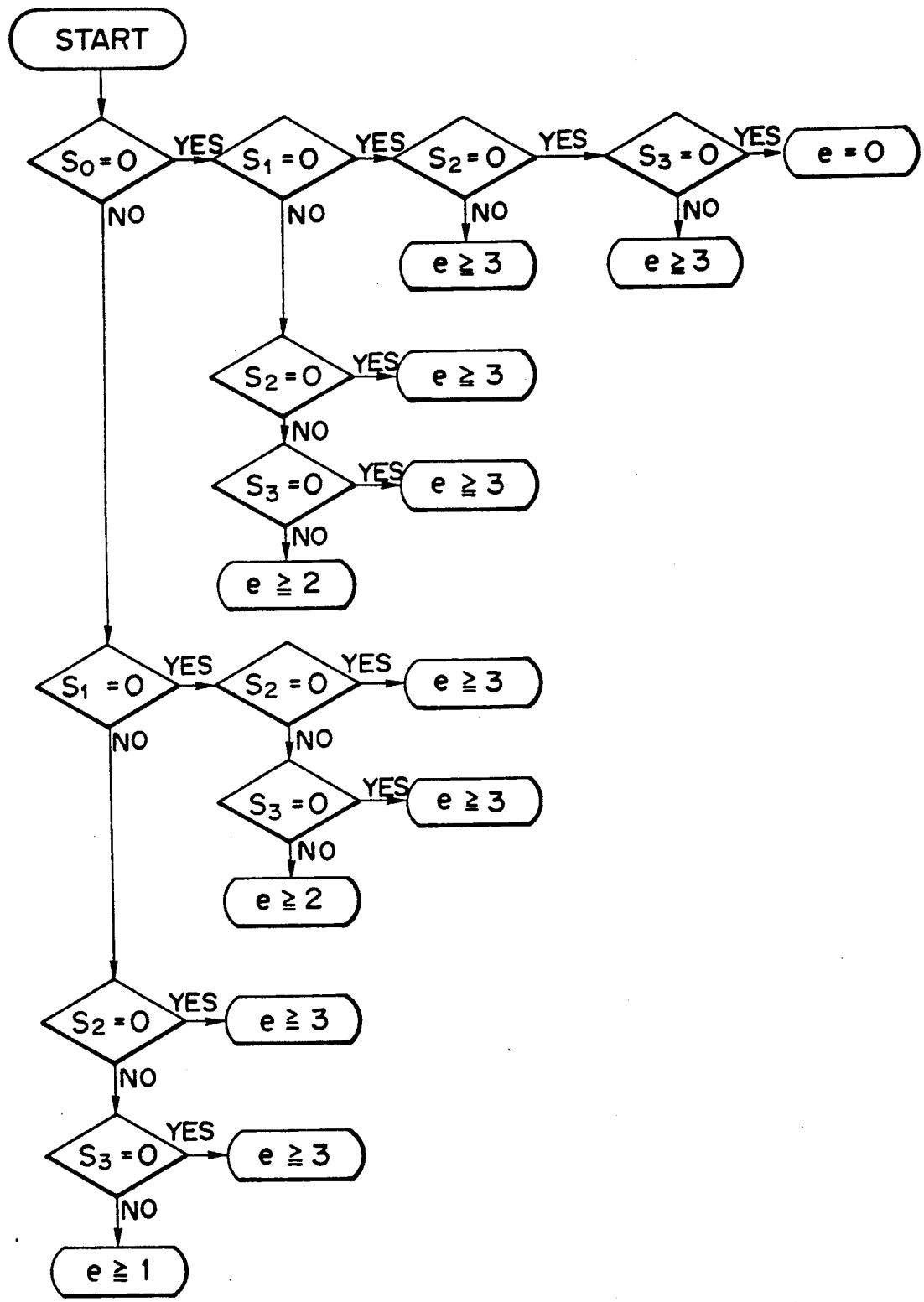
FIG. 1 is a flowchart showing the outline of the flow of conventional error correcting processes.
Figure 2:
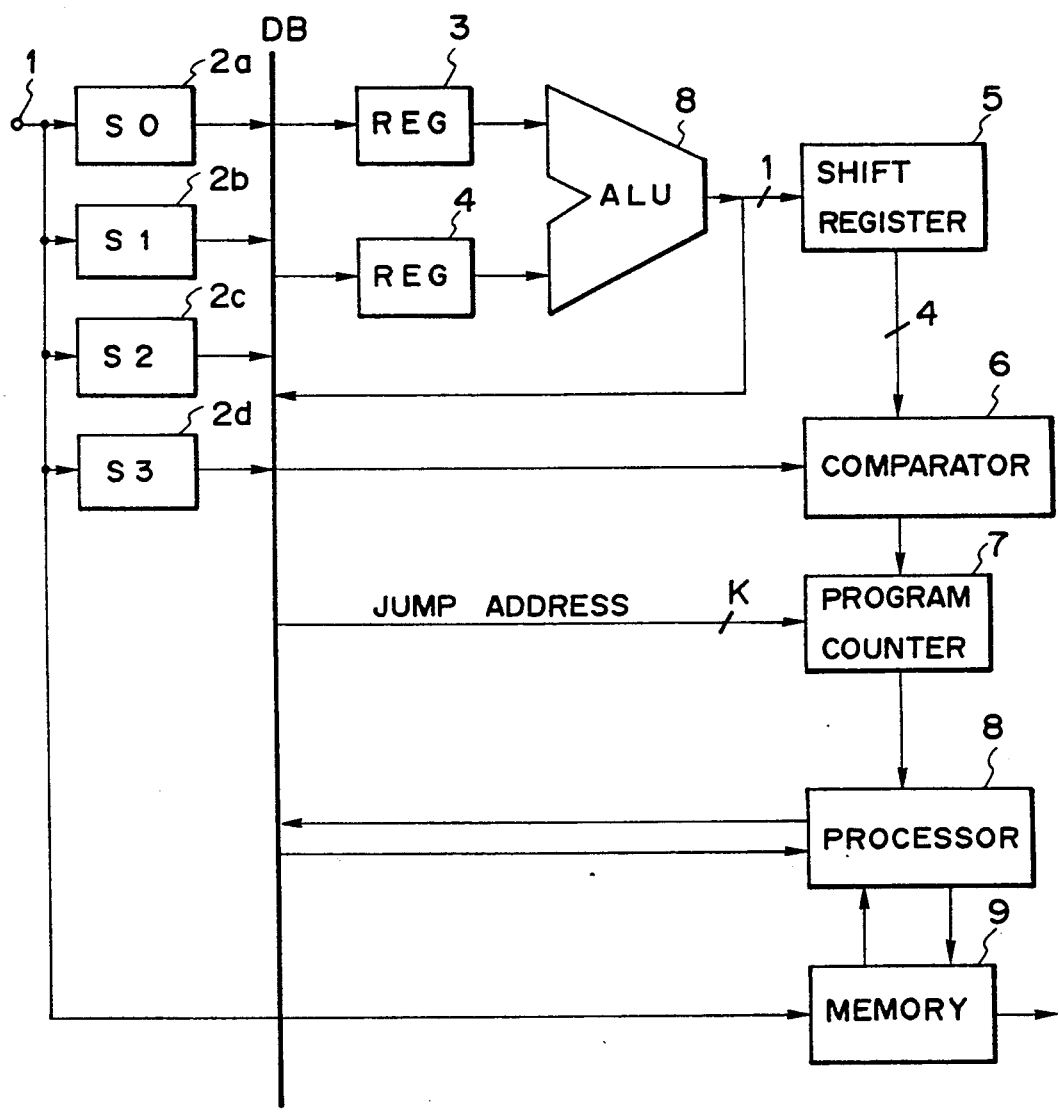
FIG. 2 is a block diagram showing a construction of a main section of an error correcting device as an embodiment of the present invention.

FIG. 2 is a diagram showing a construction of a program processing section as a main section in an error correcting device as an embodiment of the invention.

In the diagram, reference numeral 1 denotes an input terminal of a received message word. A code word train including errors generated in a transmission path is input to the input terminal 1. Syndrome calculating circuits 2a, 2b, 2c, and 2d calculate the syndromes $S_0$, $S_1$, $S_2$, and $S_3$ in accordance with the foregoing equation (6), respectively. The error correcting process is executed by operating a processor 8 in accordance with programs which have previously been described.

Figure 3:
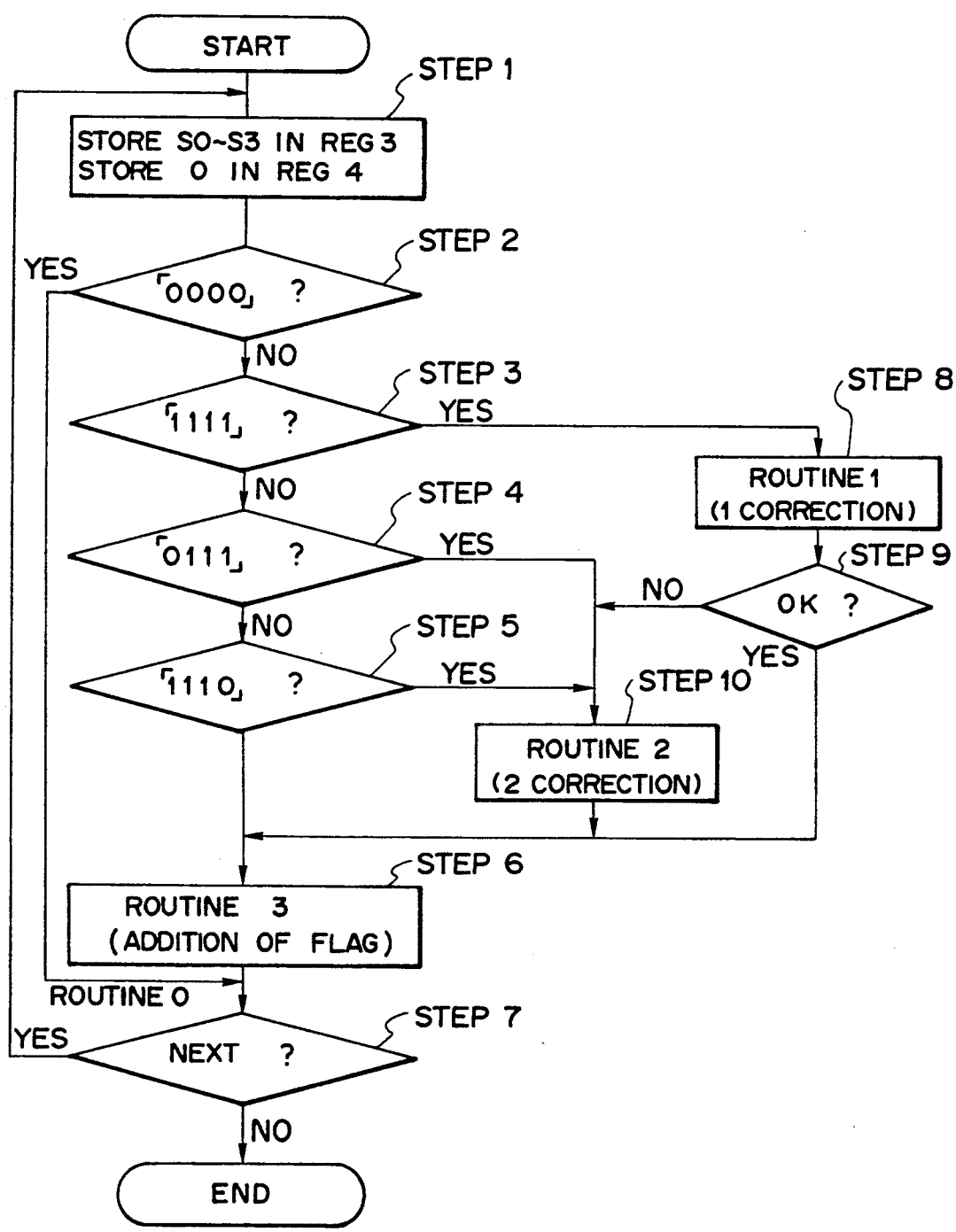
FIG. 3 is a flowchart showing the outline of the flow of error correcting processes according to the device of FIG. 2.

FIG. 3 is a flowchart for explaining the processes according to the above programs. The processing programs which are executed by the processor 8 will now be described hereinbelow in accordance with the flowchart of FIG. 3.

Step 1 in FIG. 3 will be first executed. In step 1, a gate of the calculating circuit 2a is opened and the syndrome $S_0$ is output to a data bus DB and is temporarily stored into a register REG 3 as a temporary memory circuit. Next, to check whether $S_0=0$ or not, the value 0 is output from a program memory in the processor 8 to the data bus (DB) and is temporarily stored into a register REG 4. The operations of the calculating circuits 2a to 2d, REG 3, and REG 4 can be controlled by the processor 8 through a control bus (not shown).

At this time, the processor (ALU) as an arithmetic operating unit 8 compares outputs of the REG 3 and REG 4 and outputs the result of the comparison as a 1-bit data. That is, when the syndrome $S_0$ is equal to 0, the ALU 8 outputs "0". When the syndrome $S_0$ is set to a value other than 0, the ALU 8 outputs "1". The output of the ALU 8 is input as a 1-bit data to a shift register 5.

By repeating the above processes with respect to the syndromes $S_1$, $S_2$, and $S_3$, respectively, four data (check codes) indicating whether the syndromes $S_0$ to $S_3$ are equal to 0 or not are stored in the shift register 5, so that a 4-bit data is derived.

Table 2 shows the corresponding relations in the case where the results of the determination of Table 1 are expressed as a 1-bit data as an output of the ALU 8 and the processing routines to be shifted are expressed by "0", "1", "2", and "3" in correspondence to the number of errors.

TABLE 2

| $S_0$ | $S_1$ | $S_2$ | $S_3$ | e |
|---|---|---|---|---|
| 0 | 0 | 0 | 0 | 0 |
| 0 | 0 | 0 | 1 | 3 |
| 0 | 0 | 1 | 0 | 3 |
| 0 | 0 | 1 | 1 | 3 |
| 0 | 1 | 0 | 0 | 3 |
| 0 | 1 | 0 | 1 | 3 |
| 0 | 1 | 1 | 0 | 3 |
| 0 | 1 | 1 | 1 | 2 |
| 1 | 0 | 0 | 0 | 3 |
| 1 | 0 | 0 | 1 | 3 |
| 1 | 0 | 1 | 0 | 3 |
| 1 | 0 | 1 | 1 | 2 |
| 1 | 1 | 0 | 0 | 3 |
| 1 | 1 | 0 | 1 | 3 |
| 1 | 1 | 1 | 0 | 3 |
| 1 | 1 | 1 | 1 | 1 |

Therefore, in step 2 in FIG. 3, a 4-bit pattern "0000" corresponding to the routine "0" in Table 2 is input to a comparator 6 from the data bus DB. At this time, an address (k bits) on the jump destination side of the program to execute the routine "0" is input to a program counter 7 from the data bus DB. The comparator 6 compares an output of the shift register 5 with "0000". When they coincide, the program counter 7 is set by the jump destination address data. In association with it, the process of the routine "0" is executed by a processing section (not shown).

The process of the routine "0" is executed in the case where no error exists as mentioned above. In this routine, the error correcting process is not executed but the next process of the received message is executed. In FIG. 3, the process of the routine "0" corresponds to the process to jump the program from step 2 to step 7.

In step 2, if it is decided that the output of the shift register 5 is not "0000", a 4-bit pattern "1111" corresponding to the routine "1" is input to the comparator 6 from the data bus DB. In a manner similar to the above, when the output of the shift register 5 is set to "1111", the program counter 7 is set by the jump destination address data corresponding to step 8 in FIG. 3, namely, the routine "1". The process of the routine "1" relates to the single-error correcting process as mentioned above. In the case where the code stored in a memory 9 was error corrected by the routine "1", the processing routine advances from step 9 to step 6 (routine "3"addition of correction flap). If the error correction cannot be executed, the processing routine advances from step 9 to step 10 (routine "2").

Further, if it is determined in steps 2 and 3 that the output of the shift register 5 is neither "0000" nor "1111", 4-bit patterns "0111" and "1011" corresponding to the routine "2" are sequentially input to the comparator 6. When the 4-bit pattern coincides with the output of the shift register 5, the program counter 7 is set by the jump destination address data corresponding to the routine "2". Thus, the processing routine of the program advances to the routine "2" (step 10).

The process of the routine "2" relates to the double-error correcting process as mentioned above. After the processor 8 corrected the code stored in the memory 9, the processing routine advances to the routine "3" (step 6). There is no need for an "OK" decision as in step 9 since error correction is completed in step 10. Therefore, the flag operation of step 6 may be entered directly from step 10.

On the other hand, if data other than "0000" "0111", "1111", and "1011" has been stored in the shift register, the processing routine directly advances to the routine "3" (step 6). The program is set so as to automatically execute the shifting from step 5 to step 6 in the case where the program counter 7 is not preset.

By constructing the error correcting device as mentioned above, the number of jumping times to change the flow of the program can be reduced and the error correction processing speed can be made high as a whole and the program area can be reduced.

Figure 4:
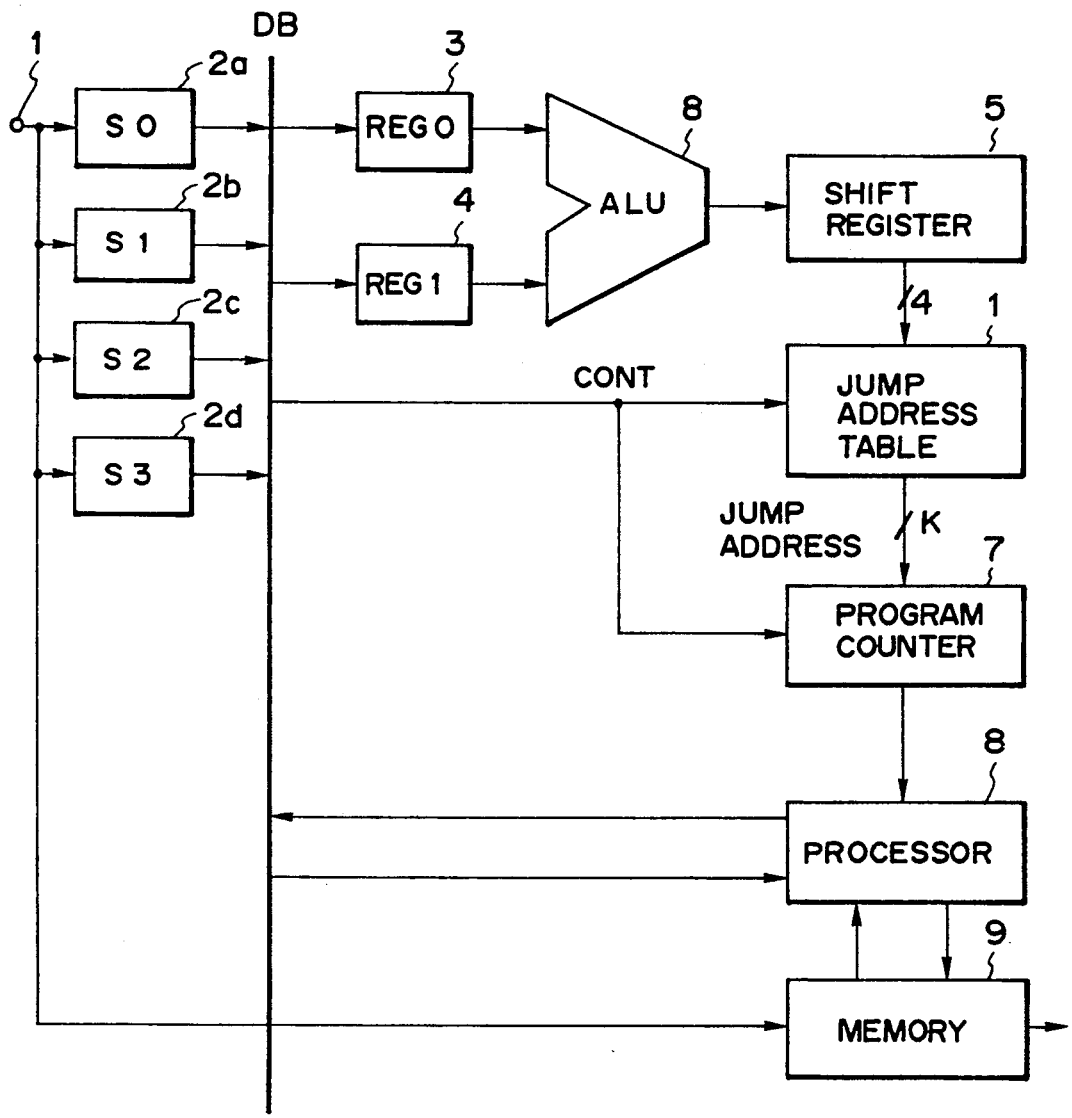
FIG. 4 is a block diagram showing a construction of the main section in an error correcting device as another embodiment of the invention.

FIG. 4 is a diagram showing a construction of a program processing circuit as a main section of an error correcting device as another embodiment of the invention. In the diagram, the parts and components similar to those in FIG. 2 are designated by the same reference numerals and their descriptions are omitted.

In the construction of the embodiment shown in FIG. 4, the 4-bit data which is output from the shift register 5 is given to a jump address table 1. In response to a control signal (CONT) from the data bus DB, the jump address table 9 outputs data indicative of the jump destination address of each routine (refer to FIGS. 2 and 3) corresponding to the 4-bit data. The control signal CONT is also input to the program counter 7. In response to the control signal CONT, the program counter 7 is preset by the address data from the table 1.

Even in the embodiment of FIG. 4, it is readily understood that effects similar to the embodiment of FIG. 2 are obtained. Further, in the embodiment of FIG. 4, the four comparing operations of the comparator 6 in the embodiment of FIG. 2 can be executed in a single step, so that the processing speed can be further increased.

In the above embodiment, the results of the discriminations to see if the syndromes $S_0$ to $S_3$ are equal to 0 or not are used as check codes and are simultaneously output, thereby realizing the high processing speed. However, similar effects can be also obtained even when the invention is applied by using the results of the discriminations to see if the numerators and denominator of the coefficients $\sigma_1$ and $\sigma_2$ of the foregoing error location polynomial are set to 0 or not as check codes.

For instance, the construction shown in FIG. 2 is used as it is, $(S_1^2+S_0S_2)$, $(S_0S_3+S_1S_2)$, and $(S_1S_3+S_2^2)$ are sequentially stored into the REG 3, and 0 is stored into the REG 4, thereby sequentially inputting the 1-bit check codes indicating whether those data are equal to 0 or not into the shift register 5. By supplying those data together with the control signal CONT to the jump address table, the program is shifted to a desired routine.

Although the embodiments have been described with respect to a particular example of the double-error correction Reed Solomon code, similar effects may also obtained by applying the principles of the invention to an error correcting device using error correction code.

As described above, according to the invention, an error correcting device in which high processing speed can be realized and the program area can be reduced can be obtained.

What is claimed is:
1. An error correcting device comprising:
   (a) a processor for executing a processing program which includes a plurality of error correction processing routines for correcting different numbers of errors, said processor being used to correct errors in a received message;
   (b) a data bus which is accessible by said processor;
   (c) syndrome calculating means for calculating a plurality of syndromes by using the received message, said syndrome calculating means serially outputting the plurality of syndromes to said data bus;
   (d) first means for sequentially forming and serially outputting a plurality of check codes to determine a shift to one of said plurality of code error correction processing routines, wherein the plurality of syndromes on said data bus are used in forming said check codes;
   (e) second means for outputting said plurality of check codes in parallel; and
   (f) third means for executing the shift of the processing program in accordance with an output of the second means.

2. A device according to claim 1, wherein said plurality of check codes are codes indicating whether said plurality of syndromes are equal to 0 or not.

3. A device according to claim 1, wherein said first means includes means for calculating a plurality of coefficients of an error location polynomial by using said plurality of syndromes, and said plurality of check codes are codes indicating whether a numerator or a denominator of said plurality of coefficients is equal to 0 or not.

4. A device according to claim 1, wherein said second means includes a shift register to which said check codes are serially input and which can output in parallel codes stored in each register.

5. A device according to claim 1, wherein said third means includes a discriminating device to discriminate whether a pattern of the check codes which were output in parallel coincides with a special code pattern to shift the process or not.

6. A device according to claim 5, wherein a plurality of said special code patterns are prepared and said discriminating device sequentially discriminates whether said plurality of code patterns coincide with a pattern of the check codes or not.

7. A device according to claim 5, wherein said third means includes a program counter to determine a processing step of the processor and said program counter is set by preset data corresponding to either one of said plurality of kinds of error correction processing routines in accordance with an output of said discriminating device.

8. A device according to claim 1, wherein said third means includes a data table to which the check codes which were output in parallel are input and which selectively reads out a plurality of preset data corresponding to said plurality of kinds of error correction processing routines.

9. A device according to claim 8, wherein said third means includes a program counter to determine a processing step of the processor and said program counter is preset by an output of said data table.

10. An error correcting device comprising:
(a) a processor for executing a processing program which includes a plurality of error correction processing routines for correcting different numbers of errors, said processor being used to correct errors in a received message, and said processor generating special code patterns to shift the processing thereof;
(b) first means for sequentially forming and serially outputting a plurality of check codes to determine a shift to one of said plurality of error correction processing routines, wherein said received message is used in forming said check codes;
(c) second means for outputting said plurality of check codes in parallel;
(d) discriminating means for discriminating whether a pattern of the check codes which were output in parallel by the second means coincides with the special code patterns or not; and
(e) third means for executing the shift of the processing in the processing program in accordance with an output of said discriminating means.

11. A device according to claim 10, wherein a plurality of said special code patterns are prepared and said discriminating means sequentially discriminates whether said plurality of code patterns coincide with a pattern of the check codes or not.

12. A device according to claim 10, wherein said third means includes a program counter to determine a processing step of the processor and said program counter is set by preset data corresponding to one of said plurality of kinds of error correction processing routines in accordance with an output of said discriminating means.

13. An error correcting device comprising:
(a) a processor for executing a processing program which includes a plurality of error correction processing routines for correcting different numbers of errors, said processor being used to correct errors in a received message;
(b) first means for sequentially forming and serially outputting a plurality of check codes to determine a shift to one of said plurality of error correction processing routines, said received message being used in forming said check codes;
(c) second means for outputting said plurality of check codes in parallel;
(d) a data table for selectively reading out a plurality of data corresponding to said plurality of error correction processing routines in accordance with an output of the second means; and
(e) third means for executing the shift of the process in the processing program in accordance with the data which was read out of the data table.

14. A device according to claim 13, wherein said third means includes a program counter to determine a processing step of the processor and said program counter is set by an output by the data table.

* * * * *